(12) United States Patent
Nikipelov et al.

(10) Patent No.: US 11,143,975 B2
(45) Date of Patent: Oct. 12, 2021

(54) LITHOGRAPHIC APPARATUS COMPRISING AN OBJECT WITH AN UPPER LAYER HAVING IMPROVED RESISTANCE TO PEELING OFF

(71) Applicant: ASML NETHERLANDS B.V., Veldhoven (NL)

(72) Inventors: Andrey Nikipelov, Eindhoven (NL); Vadim Yevgenyevich Banine, Deurne (NL); Joost André Klugkist, Waalre (NL); Maxim Aleksandrovich Nasalevich, Eindhoven (NL); Roland Johannes Wilhelmus Stas, 's-Hertogenbosch (NL); Sando Wricke, Nuenen (NL)

(73) Assignee: ASML Netherlands B.V., Veldhoven (NL)

( * ) Notice: Subject to any disclaimer, the term of this patent is extended or adjusted under 35 U.S.C. 154(b) by 200 days.

(21) Appl. No.: 16/472,712

(22) PCT Filed: Nov. 27, 2017

(86) PCT No.: PCT/EP2017/080472
§ 371 (c)(1),
(2) Date: Jun. 21, 2019

(87) PCT Pub. No.: WO2018/114229
PCT Pub. Date: Jun. 28, 2018

(65) Prior Publication Data
US 2021/0132517 A1    May 6, 2021

(30) Foreign Application Priority Data

Dec. 22, 2016  (EP) .................................... 16206194
Feb. 16, 2017  (EP) .................................... 17156510

(51) Int. Cl.
*G03F 7/20*   (2006.01)
*G03F 9/00*   (2006.01)

(52) U.S. Cl.
CPC .................................. *G03F 9/7076* (2013.01)

(58) Field of Classification Search
CPC .... G03F 9/7076; G03F 7/7095; G03F 7/0002; G03F 7/0955; G03F 7/70341;
(Continued)

(56) References Cited

U.S. PATENT DOCUMENTS 6,169,316 B1 * 1/2001 Sakai .................... G01L 19/146
257/417
2004/0207824 A1 10/2004 Lof et al.
(Continued)

FOREIGN PATENT DOCUMENTS

CN    101329517    12/2008
CN    101477304     7/2009
(Continued)

OTHER PUBLICATIONS

International Search Report and Written Opinion issued in corresponding PCT Patent Application No. PCT/EP2017/080472, dated Feb. 26, 2018.
(Continued)

*Primary Examiner* — Mesfin T Asfaw
(74) *Attorney, Agent, or Firm* — Pillsbury Winthrop Shaw Pittman LLP

(57) ABSTRACT

A lithographic apparatus has an object, the object includes: a substrate and optionally a lower layer on the substrate; an upper layer; and an intermediate layer between the upper layer and the substrate, wherein a bond strength between the intermediate layer and the substrate or lower layer is greater than a bond strength between the intermediate layer and the upper layer and the intermediate layer has a Young's Modu-
(Continued)

lus and/or a Poisson ratio within 20% of that of the upper layer.

23 Claims, 4 Drawing Sheets

(58) Field of Classification Search
CPC .............. G03F 7/7085; H01L 21/6836; H01L 23/53295; H01L 21/31138; H01L 23/53238; H01L 24/11; H01L 21/76838; H01L 33/04; C23C 28/044; C23C 16/26; C23C 14/0605; C23C 14/0036; C23C 30/00; G02B 1/118; B32B 37/142; B32B 7/14; B32B 27/148; B32B 7/02; H05K 3/244; G11B 5/702; H01R 4/58
See application file for complete search history.

(56) References Cited

U.S. PATENT DOCUMENTS

| | | | |
|---|---|---|---|
| 2005/0041225 | A1 | 2/2005 | Sengers et al. |
| 2006/0109447 | A1 | 5/2006 | Moest et al. |
| 2007/0263182 | A1 | 11/2007 | Nakano et al. |
| 2008/0138623 | A1* | 6/2008 | Franciscus Van Haren ................ G03F 9/7076 428/411.1 |
| 2008/0138631 | A1 | 6/2008 | Patel et al. |
| 2008/0316441 | A1 | 12/2008 | Liebregts et al. |
| 2010/0321695 | A1 | 12/2010 | Van Buel et al. |
| 2011/0116060 | A1 | 5/2011 | Dziomkina et al. |
| 2011/0199592 | A1 | 8/2011 | De Graff et al. |
| 2013/0016329 | A1 | 1/2013 | Tanimoto |
| 2014/0084421 | A1 | 3/2014 | Tseng et al. |
| 2015/0041985 | A1* | 2/2015 | Hsieh .................... H01L 23/525 257/773 |
| 2016/0149249 | A1* | 5/2016 | Pozvonkov ......... H01M 8/1016 429/490 |

FOREIGN PATENT DOCUMENTS

| | | |
|---|---|---|
| CN | 104210046 | 12/2014 |
| DE | 19848942 | 5/2000 |
| EP | 1402298 | 5/2004 |
| JP | 2003243543 | 8/2003 |
| JP | 2007059522 | 3/2007 |
| WO | 2005010611 | 2/2005 |
| WO | 2015067477 | 5/2015 |
| WO | 2015142914 | 9/2015 |
| WO | 2015197195 | 12/2015 |

OTHER PUBLICATIONS

Beghini, M, et al.: "Measurement of Coatings' Elastic Properties by Mechanical Methods: Part 1. Consideration on Experimental Errors", Experimental Mechanics, vol. 41, No. 4, Dec. 1, 2001.
Chinese Office Action issued in corresponding Chinese Patent Application No. 201780087227.6, dated Dec. 2, 2020.

* cited by examiner

LITHOGRAPHIC APPARATUS COMPRISING AN OBJECT WITH AN UPPER LAYER HAVING IMPROVED RESISTANCE TO PEELING OFF

CROSS-REFERENCE TO RELATED APPLICATIONS

This application is the U.S. national phase entry of PCT Patent Application No. PCT/EP2017/080472, which was filed on Nov. 27, 2017, which claims the benefit of priority of European patent application no. 16206194.9, which was filed on Dec. 22, 2016, and European patent application no. 17156510.4, which was filed on Feb. 16, 2017 and each of which is incorporated herein in its entirety by reference.

FIELD

The present invention relates to an object in a lithographic apparatus in which the object has a layer applied to it. The present invention relates in particular to a sensor mark for a sensor for a lithography apparatus and a method of manufacturing a device using a lithography apparatus.

BACKGROUND

A lithography apparatus is a machine that applies a desired pattern onto a substrate, usually onto a target portion of the substrate. A lithography apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithography apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti parallel to this direction.

In an immersion lithography apparatus, a liquid is confined to an immersion space by a liquid confinement structure. The immersion space is between a final optical element of a projection system through which the pattern is imaged and the substrate onto which the pattern is transferred or a substrate table on which the substrate is held. The liquid may be confined to the immersion space by a fluid seal. The liquid confinement structure may create or use a flow of gas, for example to help in controlling the flow and/or the position of the liquid in the immersion space. The flow of gas may help form the seal to confine the liquid to the immersion space. At least part of the substrate support table is coated with a coating with limited hydrophilicity to reduce liquid loss due to motion of the substrate support table with respect to the final optical element. At least part of sensors that are integrated into substrate support table is coated with a coating with limited hydrophilicity to reduce liquid loss and to reduce heat load by remaining liquid evaporation.

Immersion lithograph apparatus rely on several sensors integrated into the support table which supports the substrate. These sensors are used for:

substrate/support table alignment with respect to a reference frame;

lens (re)adjustment, setup, heating compensation; and reticle (mask) heating compensation.

Sensors' marks are integrated into a stack of thin film layers which is deposited on a transparent (quartz) plate built into the support table and act as:

spatial transmission filters for DUV (Integrated Lens Interferometry At Scanner "ILIAS" sensor, Parallel ILIAS sensor (PARIS), Transmission Image Sensor "TIS" sensor functionality).

spatial reflective filters for Visible Radiation "VIS", Near Infra Red "NIR", Mid-Infra Red "MIR" (Smart Alignment Sensor Hybrid "SMASH" sensor functionality).

The reflection from the top surface of the stack (mark-free region) is used for the level sensor.

Adhesion of an upper hydrophobic layer (e.g. a layer with limited hydrophilicity) can be a difficulty resulting in the upper hydrophobic layer peeling off.

Hydrophobic layers (e.g. layers with limited hydrophilicity) are applied to other objects in a lithographic apparatus. Indeed many objects in a lithographic apparatus have a coating or layer applied thereon. It can be difficult to prevent a coating or layer from peeling off an object. Peeling off of a coating or layer is undesirable for many reasons including the undesirable generation of particles which can introduce imaging errors if they find their way into a beam path for imaging the substrate or a sensor as well as the fact that the property desired by the presence of the coating or layer is no longer present once the coating or layer has peeled off the object.

SUMMARY

It is desirable, to provide an object in a lithographic apparatus with a upper layer (e.g., coating) which has improved resistance to peeling off, for example, to provide a sensor mark with improved hydrophobic (e.g. limited hydrophilicity) coating adhesion.

According to an aspect, there is provided a lithographic apparatus comprising: an object, the object comprising: a substrate and optionally a lower layer; an upper layer; and an intermediate layer between the upper layer and the substrate, wherein a bond strength (or number of chemical bonds per unit area) between the intermediate layer and the substrate or lower layer being greater than a bond strength (or number of chemical bonds per unit area) between the intermediate layer and the upper layer and the intermediate layer has a Young's Modulus and/or a Poisson ratio within 20% of that of the upper layer.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
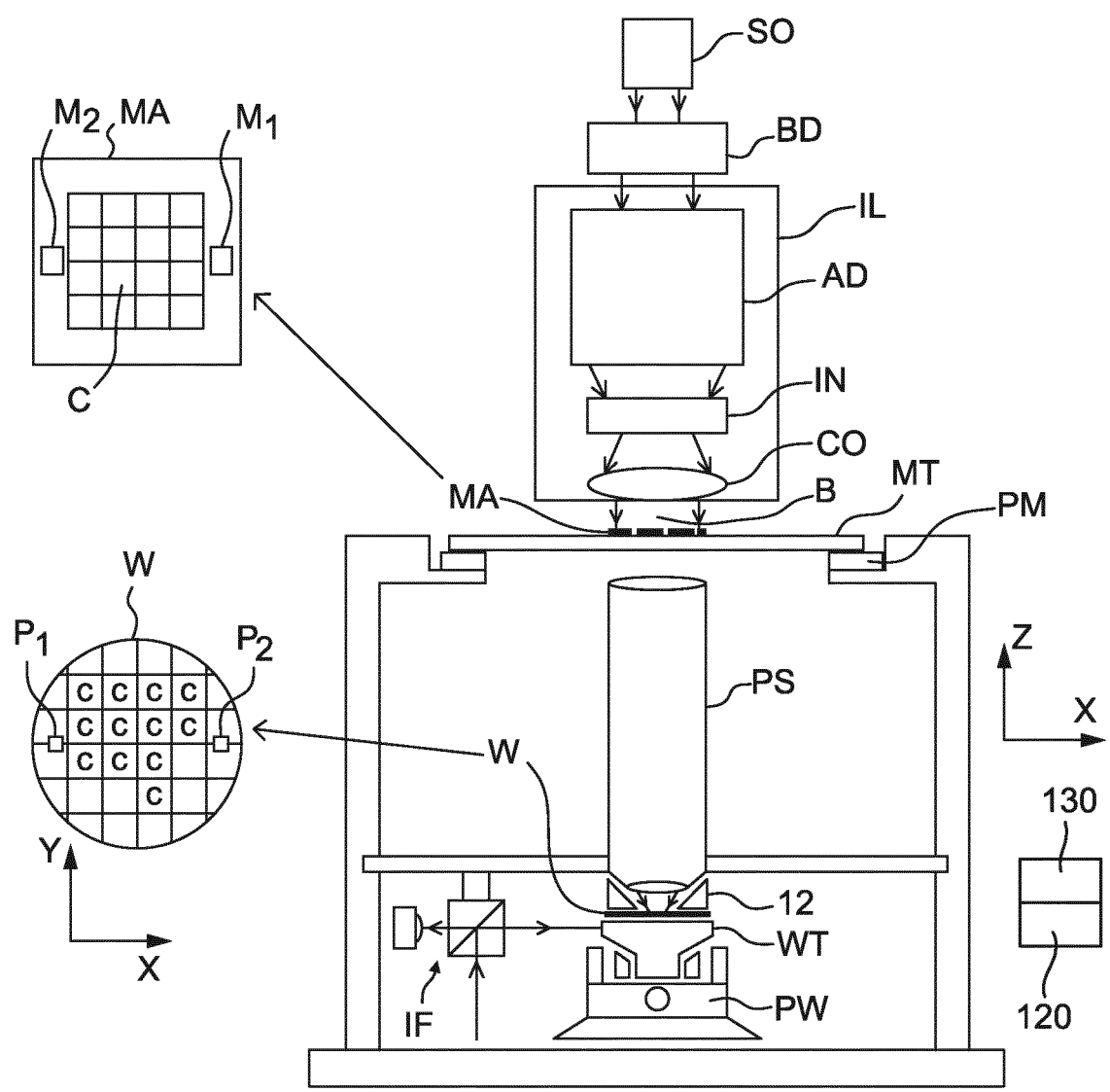
FIG. 1 schematically depicts a lithography apparatus.

FIG. 1 schematically depicts a lithography apparatus according to one embodiment of the invention. The apparatus includes an illumination system (illuminator) ILL configured to condition a projection beam B (e.g. UV radiation or any other suitable radiation), a support structure (e.g. a mask table) MT constructed to support a patterning device (e.g. a mask) MA and connected to a first positioning device PM configured to accurately position the patterning device in accordance with certain parameters. The apparatus also includes a support table (e.g. a wafer table) WT or "substrate support" or "substrate table" constructed to hold a substrate (e.g. a resist-coated wafer) W and connected to a second positioning device PW under control of positioner 130 configured to accurately position the substrate in accordance with certain parameters. The apparatus further includes a projection system (e.g. a refractive projection lens system) PS configured to project a pattern imparted to the projection beam B by the patterning device MA onto a target portion C (e.g. including one or more dies) of the substrate W.

The illumination system IL may include various types of optical components, such as refractive components, reflective components, magnetic components, electromagnetic components, electrostatic components or other types of optical components, or any combination thereof, for directing, shaping, or controlling radiation.

The support structure MT supports, i.e. bears the weight of, the patterning device MA. It holds the patterning device MA in a manner that depends on the orientation of the patterning device MA, the design of the lithography apparatus, and other conditions, such as for example whether or not the patterning device MA is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion C of the substrate W. It should be noted that the pattern imparted to the projection beam B may not exactly correspond to the desired pattern in the target portion C of the substrate W, for example if the pattern includes phase-shifting features or so called assist features. Generally, the pattern imparted to the projection beam B will correspond to a particular functional layer in a device being created in the target portion, such as an integrated circuit.

The patterning device MA may be transmissive or reflective. Examples of patterning devices include masks, programmable minor arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the minor matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithography apparatus may be of a type having two (dual stage) or more stages or tables. At least one of the tables has a substrate support that can hold a substrate. At least one of the tables may be a measurement table that is not configured to hold a substrate. In an embodiment two or more of the tables each have a substrate support. The lithography apparatus may have two or more patterning device tables or "mask supports". In such "multiple stages" machines the additional tables or supports may be used in parallel, or preparatory steps may be carried out on one or more tables or supports while one or more other tables or supports are being used for exposure.

The lithography apparatus is of a type wherein at least a portion of the substrate W may be covered by a liquid having a relatively high refractive index, e.g. water such as ultra pure water (UPW), so as to fill an immersion space between the projection system PS and the substrate W. An immersion liquid may also be applied to other spaces in the lithography apparatus, for example, between the patterning device MA and the projection system PS. Immersion techniques can be used to increase the numerical aperture of projection systems. The term "immersion" as used herein does not mean that a structure, such as a substrate W, must be submerged in liquid; rather "immersion" only means that a liquid is located between the projection system PS and the substrate W during exposure. The path of the patterned radiation beam from the projection system PS to the substrate W is entirely through liquid.

Referring to FIG. 1, the illuminator IL receives a radiation beam from a radiation source SO. The source and the lithography apparatus may be separate entities, for example when the source is an excimer laser. In such cases, the source is not considered to form part of the lithography apparatus. In arrangements where the source is separate from the lithography apparatus, the radiation beam is passed from the source SO to the illuminator IL with the aid of a beam delivery system BD including, for example, suitable directing mirrors and/or a beam expander. In other cases the source may be an integral part of the lithography apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as -outer and -inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section. Similar to the source SO, the illuminator IL may or may not be considered to form part of the lithography apparatus. For example, the illuminator IL may be an integral part of the lithography apparatus or may be a separate entity from the lithography apparatus. In the latter case, the lithography apparatus may be configured to allow the illuminator IL to be mounted thereon. Optionally, the illuminator IL is detachable and may be separately provided (for example, by the lithography apparatus manufacturer or another supplier).

The projection beam B is incident on the patterning device MA (e.g., mask), which is held on the support structure MT (e.g., mask table), and is patterned by the patterning device MA. The projection beam B having been patterned by the patterning device MA may be referred to as a patterned beam. Having traversed the patterning device MA, the projection beam B passes through the projection system PS, which focuses the beam onto a target portion C of the substrate W. With the aid of the second positioning device PW and position sensor IF (e.g. an interferometric device, encoder or capacitive sensor), the support table WT can be moved accurately, e.g. so as to position different target portions C in the path of the projection beam B. Similarly, the first positioning device PM and another position sensor (which is not explicitly depicted in FIG. 1) can be used to accurately position the patterning device MA with respect to the path of the projection beam B, e.g. after mechanical retrieval from a mask library, or during a scan.

In general, movement of the support structure MT may be realized with the aid of a long-stroke module (coarse positioning) and a short-stroke module (fine positioning), which form part of the first positioning device PM. Similarly, movement of the support table WT or "substrate support" may be realized using a long-stroke module and a short-stroke module, which form part of the second positioning device PW.

The patterning device MA and substrate W may be aligned using patterning device alignment marks M1, M2 and substrate alignment marks P1, P2. Although the substrate alignment marks P1, P2 as illustrated occupy dedicated target portions, they may be located in spaces between target portions (these are known as scribe-lane alignment marks). Similarly, in situations in which more than one die is provided on the patterning device, the patterning device alignment marks M1, M2 may be located between the dies.

The lithographic apparatus further includes a control unit 120 which controls all the movements and measurements of the various actuators and sensors described. The control unit 120 also includes signal processing and data processing capacity to implement desired calculations relevant to the operation of the lithographic apparatus. In practice, the control unit 120 will be realized as a system of many sub-units, each handling the real-time data acquisition, processing and control of a subsystem or component within the lithographic apparatus. For example, one processing subsystem may be dedicated to servo control of the second positioning device PW. Separate units may handle different actuators, or different axes. Another sub-unit might be dedicated to the readout of the position sensor IF. Overall control of the lithographic apparatus may be controlled by a central processing unit. The central processing unit may communicate with the sub-units, with operators and with other apparatuses involved in the lithographic manufacturing process.

Arrangements for providing liquid between a final optical element of the projection system PS and the substrate can be classed into three general categories. These are the bath type arrangement, the so-called localized immersion systems and the all-wet immersion systems. An embodiment of the present invention relates particularly to the localized immersion systems.

Figure 2:
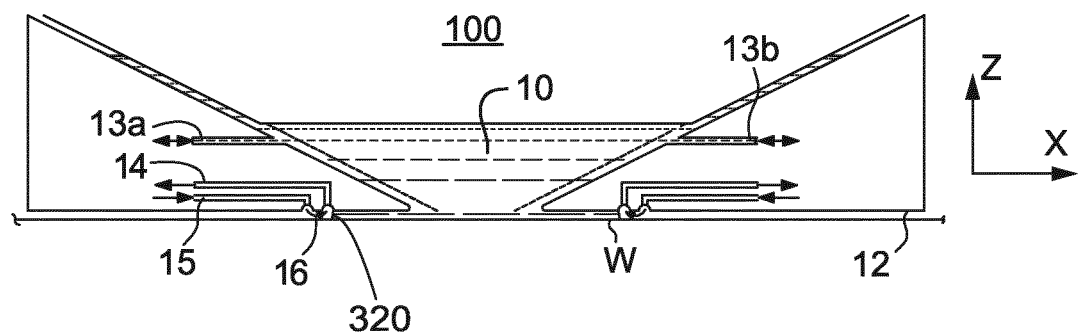
FIG. 2 schematically depicts a liquid confinement structure for use in the lithographic apparatus.

In an arrangement which has been proposed for a localized immersion system a liquid confinement structure 12 extends along at least a part of a boundary of an immersion space 10 between the final optical element 100 of the projection system PS and the facing surface of the stage or table facing the projection system PS. The facing surface of the table is referred to as such because the table is moved during use and is rarely stationary. Generally, the facing surface of the table is a surface of a substrate W, support table WT, e.g. the substrate table which surrounds the substrate W or both. Such an arrangement is illustrated in FIG. 2. The arrangement illustrated in FIG. 2 and described below may be applied to the lithography apparatus described above and illustrated in FIG. 1.

FIG. 2 schematically depicts the liquid confinement structure 12. The liquid confinement structure 12 extends along at least a part of a boundary of the immersion space 10 between the final optical element 100 of the projection system PS and the support table WT or substrate W. In an embodiment, a seal is formed between the liquid confinement structure 12 and the surface of the substrate W/support table WT. The seal may be a contactless seal such as a gas seal 16 (such a system with a gas seal is disclosed in European patent application publication no. EP-A-1,420,298) or a liquid seal.

The liquid confinement structure 12 is configured to supply and confine immersion fluid, e.g., liquid, to the immersion space 10. Immersion fluid is brought into the immersion space 10 through one of liquid openings, e.g., opening 13a. The immersion fluid may be removed through one of liquid openings, e.g., opening 13b. The immersion fluid may be brought into the immersion space 10 through at least two liquid openings, e.g., opening 13a and opening 13b. Which of liquid openings is used to supply immersion fluid and optionally which is used to remove immersion liquid may depend on the direction of motion of the support table WT.

Immersion fluid may be contained in the immersion space 10 by the gas seal 16 which, during use, is formed between the bottom of the liquid confinement structure 12 and the facing surface of the table (i.e. the surface of the substrate W and/or the surface of the support table WT). The gas in the gas seal 16 is provided under pressure via gas inlet 15 to a gap between the liquid confinement structure 12 and substrate W and/or support table WT. The gas is extracted via a channel associated with gas outlet 14. The overpressure on the gas inlet 15, vacuum level on the gas outlet 14 and geometry of the gap are arranged so that there is a high-velocity gas flow inwardly that confines the immersion fluid. The force of the gas on the immersion fluid between the liquid confinement structure 12 and the substrate W and/or support table WT contains the immersion fluid in the immersion space 10. A meniscus 320 forms at a boundary of the immersion fluid. Such a system is disclosed in United States patent application publication no. US 2004-0207824. Other liquid confinement structures 12 can be used with embodiments of the present invention.

The surfaces of many objects of a lithographic apparatus have a coating or layer applied thereon. The coating can have one or more purposes. Example purposes of a coating in a lithographic apparatus include positional control of immersion liquid, prevention of certain materials coming into contact with immersion liquid, absorption, transmission or reflection of a beam of radiation. The present invention can be applied to any upper layer which is present on an object. The term "upper" indicates that there are layers below that layer, but does not necessarily mean that there are necessarily no layers above the upper layer. It should be noted that in the present context upper layer is not synonymous with uppermost layer.

The object itself may act as a substrate (i.e. a supporting underlying substance or layer, on which a device is formed) for the upper layer or the object may have one or more lower layers under the upper layer. It should be noted that in the present context a "substrate" should be understood to include any supporting underlying substance or layer on which a device can be or is formed. This as opposed to a wafer, sometimes also referred to as a substrate W, in a different context. It should further be noted that in the present context the lower layer is not necessarily the layer directly on the substrate, but is lower with respect to the upper layer. The lower layer is between the substrate and the upper layer.

In the present invention an intermediate layer (sometimes referred to as an interface layer) is positioned between the upper layer and the substrate or lower layer, if the lower layer is present. The presence of the intermediate layer means that the upper layer is less likely to peel off than in the case that the intermediate layer is not present.

In the invention the intermediate layer has a bond strength (or number of chemical bonds per unit area) with the substrate or lower layer on which it is formed which is greater than a bond strength (or number of chemical bonds per unit area) between the intermediate layer and the upper layer and/or greater than a bond strength between the substrate or lower layer and the material of the upper layer. Here a bond strength indicates resistance of connection between two materials to the tensile and/or shear stress.

By matching the Young's Modulus and/or Poisson ratio of the intermediate layer with that of the upper layer, the chance of peeling of the upper layer is reduced. In the invention the intermediate layer has a Young's Modulus and/or Poisson ratio within 20% of that of the upper layer.

If the coefficient of thermal expansion of the intermediate layer is close to that of the upper layer, this is advantageous as well as any thermal load introduced (for example by radiation) into the upper layer and intermediate layer is less likely to result in a stress being developed between those two layers. Therefore in an embodiment the intermediate layer has a coefficient of thermal expansion within 20% of that of the upper layer.

In an embodiment, optical properties (transmission or reflection of VIS and/or NIR and/or MIR) of the intermediate layer are within 50% of that of the upper layer or the lower layer or the substrate. Here, the VIS-NIR-MIR range of wavelengths corresponds to approximately 0.5-2 µm.

The present invention will be described below in detail with reference to a sensor mark which comprises a substrate of quartz, one or more lower layers for interaction with a beam of radiation, an upper layer with limited hydrophilicity (sometimes called a hydrophobic coating or a coating), for example with which water has a contact angle of at least 75°, preferably of at least 90°) and an intermediate or interface layer between the upper layer and the lower layer.

Figure 3:
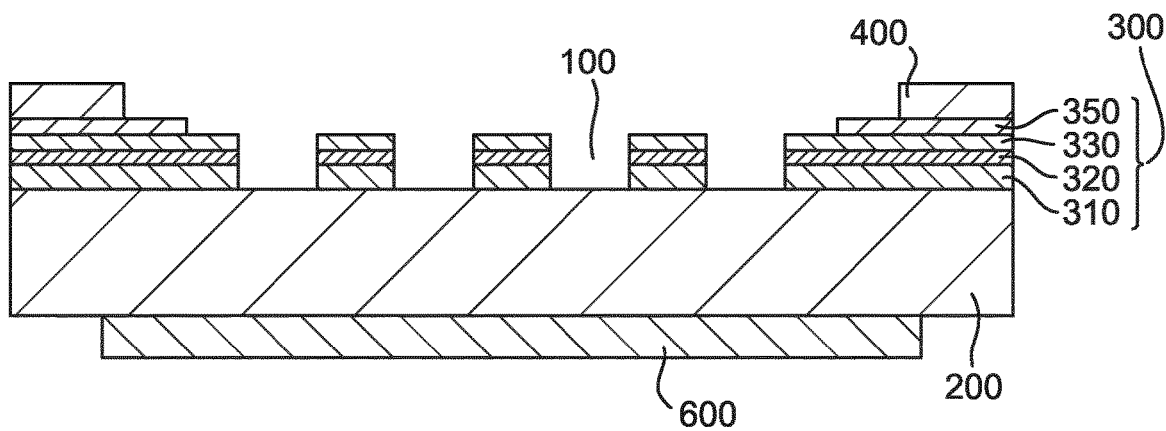
FIG. 3 is a cross-sectional view through a conventional transmissive sensor mark.
Figure 4:
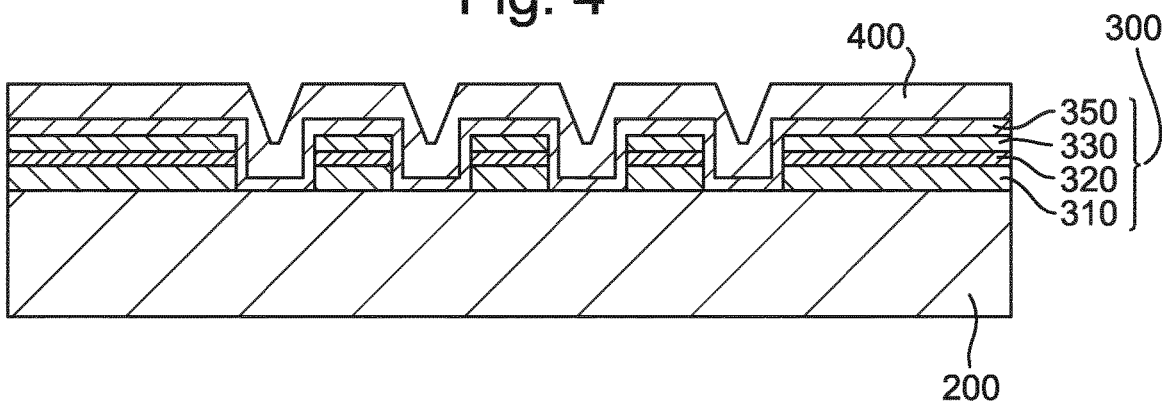
FIG. 4 is a cross-sectional view through a conventional reflective sensor mark.
Figure 5:
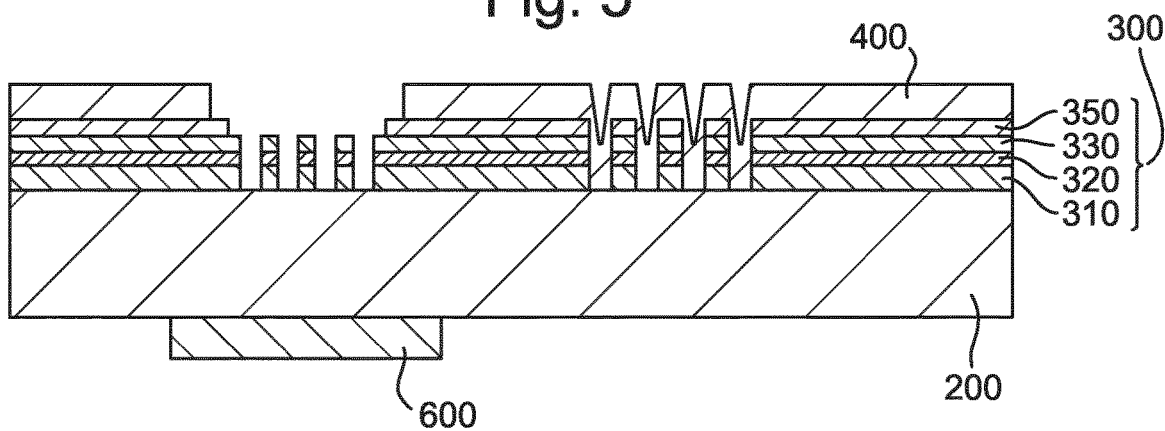
FIG. 5 shows the sensor marks of FIGS. 3 and 4 in a single quartz plate.

FIGS. 3, 4 and 5 illustrate a sensor mark of the prior art formed on a substrate, e.g., quartz ($SiO_2$) plate 200. Sensor's marks are integrated into a stack 300 of thin films which is deposited on top of the quartz plate 200. The quartz plate 200 is integrated into the support table WT. The stack 300 of thin films may comprise any number of layers. As illustrated in FIGS. 3, 4 and 5 the stack 300 comprises four layers, layers 310, 320 and 330 are layers for absorbing DUV radiation projected onto the sensor mark from above, as illustrated, and for absorbing radiation from underneath the quartz plate 200 which might be emitted by a material 600 under the quartz plate 200 which emits visible light when irradiated by DUV radiation. A lower layer 350 (lower with respect to an upper layer 400) is formed on top of the layers 310, 320, 330 of the stack 300. In an embodiment, the lower layer 350 is reflective to VIS and/or NIR and/or MIR radiation.

To provide some of the measurements the sensors pass under the liquid confinement structure 12 and so sensor marks get covered in immersion liquid. After these measurement sensors pass under the liquid confinement structure 12 again and are removed from immersion liquid. To avoid liquid being left behind on the sensor marks or on the stack 300 around marks, the upper layer 400 with limited hydrophilicity is applied to the sensor mark and/or around the sensor mark.

The purpose of these layers and their manufacture will now be described in more detail following an explanation of the use of the sensor mark in a lithographic apparatus.

Sensor marks act as:

spatial transmission filters for deep ultra violet (DUV) (PARIS, ILIAS, TIS functionality); and spatial reflective filters for VIS, NIR, MIR (SMASH functionality).

Also, the reflection from the top surface of the stack 300 (mark-free region) can be used by other sensors.

Currently sensor marks are produced via the following sequence, with reference to FIG. 3:

1) A continuous layer of blue chromium (CrOx-Cr-CrOx) 310, 320, 330, with a total thickness of ~100 nm (e.g. 50-200 nm), is deposited on the quartz plate 200. Blue chromium 310, 320, 330 is required to minimize secondary reflections of visible light from the material 600 placed under the quartz plate 200. This material 600 converts DUV to visible light, which is captured by a sensor. DUV from the projection system PS passes through holes 100 patterned in the blue chrome 310, 320, 330. Composition for CrOx is either $Cr_2O_3$, $CrO_xN_y$, or $CrO_xN_yC_z$. The layers within blue chrome 310, 320, 330 are: bottom 310 $CrO_x$=10-80 nm thick; middle 320 Cr=5-60 nm thick; and top 330 $CrO_x$=20-100 nm thick.

2) A pattern for PARIS/ILIAS/TIS/SMASH marks (1D and 2D gratings) and other marks are lithographically-deposited and then etched in blue chromium 310, 320, 330 until quartz surface is exposed (it acts as etch-stop). Through holes 100 form the pattern.

3) A layer 350 of TiN with total thickness of up to 300 nm or less than 100 nm is deposited on top of blue chromium 310, 320, 330 and quartz plate 200, it conforms to the pattern. This layer 350 will provide marks for measurements via reflection of VIS/NIR/MIR, without light leaking through quartz (VIS/IR/DUV) through these marks.

4) An upper layer 400 of coating with limited hydrophilicity (e.g. an inorganic polymer with for example a Si—O—Si—O backbone preferably with methyl groups such as Lipocer®) is applied on top of the (lower) layer 350. Below Lipocer is referred to (but this is not intended to be limiting). Lipocer is deposited on the lower (TiN) layer 350, which minimizes water loss, during the times the support table WT with sensor moves from under liquid confinement structure 12. The upper (Lipocer) layer is 50-400 nm in thickness.

5) In some spots on the sensor plate, where a high DUV dose is expected due to measurement procedure, Lipocer is not present e.g. removed (typically, a spot is ~100×100 μm² but it may also be larger, e.g. ~2×2 cm²).

Same spots will also be stripped of TiN, so to allow DUV passing to the quartz plate 200 surface through holes 100 in blue chromium 310, 320, 330. Such spots are normally over TIS, ILIAS and PARIS (referring to FIG. 3).

In FIGS. 3 and 4:

Gratings are not in scale, the typical tile size (i.e. the size of the squares of the pattern), line width of grating is 1-10 um.

DUV (projected through reticle marks and lens) passes through holes 100 in the blue chromium 310, 320, 330.

IR/VIS (from the source of SMASH measurement system) is mostly reflected from the interface Lipocer/TiN; some reflection can also occur at the interface TiN/blue chromium.

Level sensor is based on reflection from Lipocer and/or from TiN.

FIG. 3 represents a PARIS stack (and ILIAS). FIG. 4 represents a SMASH stack. FIG. 5 shows the PARIS and SMASH marks produced in the same manufacturing sequence, on the shared quartz plate 200.

To prevent galvanic corrosion of Cr (which forms a pair with stainless steel of the liquid confinement structure 12), the whole sensor mark is biased with respect to the grounded liquid confinement structure 12.

Lipocer may delaminate from TiN.

This causes a drift of level sensor (can be recalibrated but causes availability loss and production wafers loss).

If the delamination is too dramatic, this will cause water loss and temperature instability of sensors, based on gratings (ILIAS/PARIS/TIS/SMASH) by water evaporation in gas knife of liquid confinement structure 12, since drying droplets sitting in vicinity of gratings will cool down the quartz plate 200 and distort the wavefront of DUV by creating gradient of refraction index or by bending the quartz plate 200.

Lipocer adhesion to TiN may be not strong enough.

TiN is inert, so it is not possible to form chemical linking between the upper (Lipocer) layer 400 (that is a polymer, which can be deposited from Ar—$O_2$— polymer precursor plasma) and the lower layer 350 (TiN).

TiN is mechanically very different from Lipocer. Lipocer composition may be approximated by a $(SiO_z)_x(CH_3)_y$. It can be adjusted within the layer by the deposition method. Typically, for Lipocer closest to the lower layer 350, $x/y \gg 1$ and $z \sim 2$. So mechanically this part of Lipocer layer should resemble $SiO_2$.

The present inventors have noticed that the upper (Lipocer) layer 400 can delaminate from blue chromium tiles, yet it stays on the bare quartz, which is between blue chromium tiles (e.g. at the bottom of the through holes 100).

According to the boundary layer theory by Sharpe, to improve adhesion between a polymer and an underlying substrate in the absence of significant contribution from chemical bonds, one needs at least one of:

providing an interface or an intermediate layer, that will stick well to the underlying substrate (e.g., such layer may be deposited in CVD PVD or PE VD), for instance the bond of the interface or intermediate layer to the layer opposite to the upper (Lipocer) 400, i.e., lower layer 350 (e.g. TiN), is stronger than a bond of the upper (Lipocer) layer 400 to that the lower layer 350 (TiN); and having that interface layer such that its Young's modulus and Poisson ratio match well with the polymer.

Figure 6:
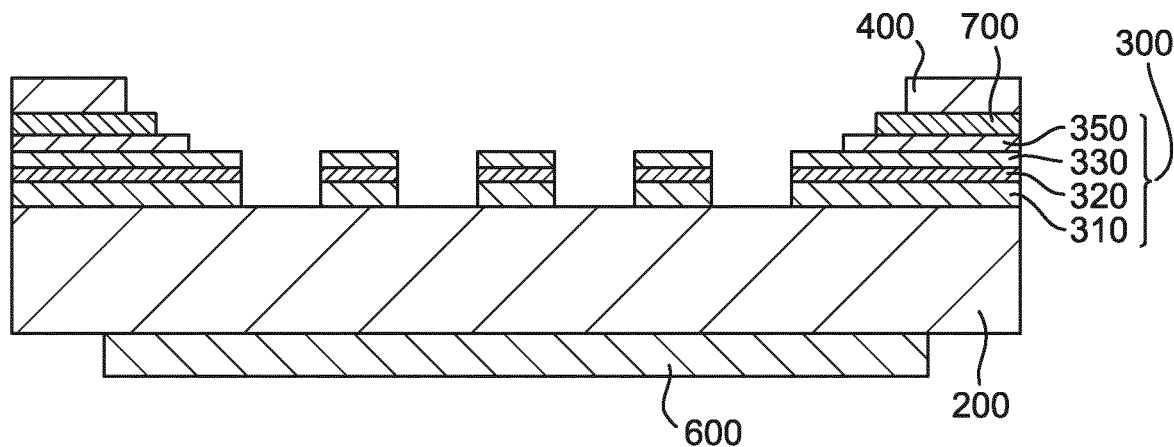
FIG. 6 is a cross-sectional view through a transmissive sensor mark of the invention.
Figure 7:
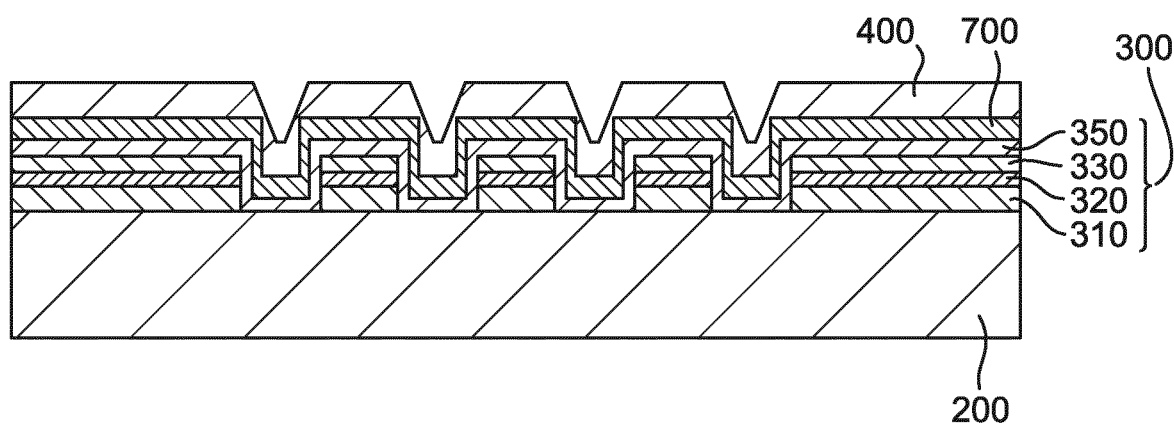
FIG. 7 is a cross-sectional view through a reflective sensor mark of the invention.

FIGS. 6 and 7 show the sensor marks of FIGS. 3 and 4 with an interface or intermediate layer 700 formed between the upper layer 400 of Lipocer and the lower layer 350 of TiN. The stack 300 of blue chromium 310, 320, 330 is also present as well as the quartz plate 200 and the material 600. A bond strength between the intermediate layer 700 and the substrate (or lower layer 350) is greater than a bond strength between the intermediate layer 700 and the upper layer 400 and/or greater than an bond strength between the substrate (or lower layer) and the material of the upper layer 400. The intermediate layer 700 has a Young's Modulus and/or a Poisson ratio within 20% of that of the upper layer 400.

Then, the interface or intermediate layer 700 and the border between it and the polymer, i.e., the upper (Lipocer) layer 400 follows the polymer subject to strain, while the strain is redistributed and applied to the border between the interface or intermediate layer 700 and the substrate, i.e., the lower (TiN) layer 350 (which is much stronger than the original connection).

Lipocer can be deposited in stages so that its bottom layer is most dense. In presence of significant amount of Oxygen in plasma, more $CH_3$ groups are removed and it is closer to pure $SiO_2$ (Aquacer), otherwise more $CH_3$ groups stay attached and it is real Lipocer.

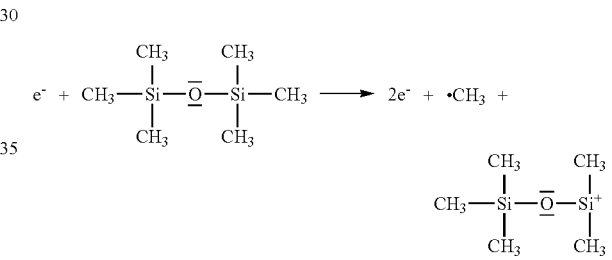

Initiation of polymerization is shown above.

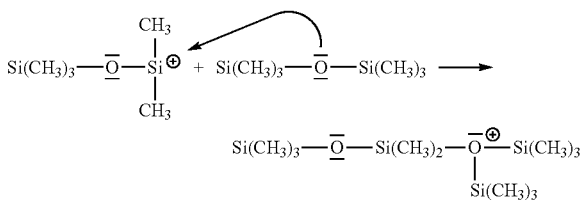

A possible polymerization reaction of Lipocer from HMDSO is shown above.

The above chemical reactions illustrate that deposition in Oxygen-rich plasma lead to composition closer to $SiO_2$ (through removal of $CH_3$ groups).

Whichever type of interface or intermediate layer 700 is added within the embodiments of invention, it should still provide a good optical interface to the upper (Lipocer) layer 400 (if it is transparent) or to the lower (TiN) layer 350 (if it is reflecting) so as to enable measurements based on marks reflecting VIS and/or NIR and/or MIR. Thus, layers with the gradient of concentrations (providing a smooth transition from the lower (TiN) layer 350 to the upper (Lipocer) layer 400 (similar to $SiO_2$)) are not optimal (as they will likely have increased absorption for VIS/NIR).

Additional benefit of the layer and of alternative layers from the embodiment is the high resistivity Immersion fluid may be ultra pure water with dissolved agents, having a finite conductivity. Should ultra pure water from the liquid confinement structure 12 reach the interface between the upper (Lipocer) layer 400 and the lower (TiN) layer 350 (Lipocer is known to be at least partially permeable), then hydrogen might build up as a consequence of recombination of H on the biased and conducting TiN surface. Hydrogen solubility in water is extremely low, thus it may promote delamination should it form bubbles on the interface between the lower (TiN) layer 350 and the upper (Lipocer) layer 400. Additionally, when the liquid reaches the interface, it will also form a conductive path from the stack/substrate to the electrolyte. This may allow galvanic corrosion reactions to occur at the stack/electrolyte interface. Apart from H+ creation, also OH— can be created, which is a highly oxidative species that could react with (degrade) the stack (TiN or blue chromium or Lipocer).

First Embodiment

An interface or intermediate layer 700 between the lower (TiN) layer 350 and the upper (Lipocer) layer 400, such that this has a combination of mechanical, chemical and optical properties:
1) Having optimal mechanical properties such as: a) having Young's modulus ~20-150 GPa ($E_{Lipocer}$ ~50-60 GPa or less), b) having Poisson ratio ~0.1-0.3 ($V_{Lipocer}$ ~0.15-0.2 or less). Lipocer properties resemble $SiO_2$ with scaling due to lower density and some missing cross-links due to —$CH_3$ termination) c) having a thickness 20-200 nm (too thin layer will have effective Young's modulus of a substrate; it is essentially too 'transparent' for phonons).
2) Having good chemical stability to ultra pure water (which may diffuse through Lipocer) and scattered DUV and has good adhesion to the underlying lower (TiN) layer 350 (preferably the interface or intermediate layer 700 is formed by deposition, for example via PVD, CVD or sputtering, with optional ion/bias activation of substrate surface). The application method and surface treatment influence both the adhesion of the layer and the presence of defects/voids, which influence the stability.
3) Being as reflective as TiN for VIS/NIR to support SMASH operation (wavelength of SMASH is in the range 0.5-2. μm) or as transparent as $SiO_2$, (or Lipocer) so as to keep level sensor and/or SMASH unchanged.
4) Ideally preventing photo-generated charge carriers to arrive at the surface, where they can react with the environment (an electrolyte: immersion liquid). Thus, it serves as a protection against photocatalytic degradation of the underlying layer in general, and of TiN degradation in particular. This photocatalytic degradation at the interface of the layer with limited hydrophilicity and the substrate would also otherwise undermine adhesion.

Although $SiO_2$ has mechanical properties matching very closely that of Lipocer and has good adhesion to Lipocer, the thermal expansion coefficient of $SiO_2$ is much lower than that of TiN. In the case of a sensor, illumination by a beam of radiation of the sensor mark results in heating of the TiN which may therefore build up undesired stress on the interface between the TiN and the $SiO_2$ because of the mismatched coefficient of thermal expansion. Additionally, $SiO_2$ has the disadvantage that, particularly when deposited in a thick layer, it can become at least partly crystalline which might contribute to scattering of a beam of radiation used by a sensor. Additionally $SiO_2$ might respond with a piezoelectric effect and warp or stress the other features of the sensor if it is partially crystalline when in a changing electric field. A lithographic apparatus has many electric fields including, for example, as a result of an electrical bias with respect to the grounded liquid confinement structure 12 used to prevent galvanic corrosion of parts of the sensor mark.

Therefore in addition to having a closely matched Young's Modulus and/or Poisson ratio, the interface or intermediate layer 700 desirably has a coefficient of thermal expansion closely matched to that of the upper (Lipocer) layer 400 and the underlying lower (TiN) layer 350 (or substrate).

Preferably the coefficient of thermal expansion of the interface or intermediate layer 700 is a value lying within the middle third of a range of coefficient of thermal expansion extending between the coefficient of thermal expansion of the upper (Lipocer) layer 400 and the coefficient of thermal expansion of the lower (TiN) layer 350 (or substrate). The middle third means the range $$x + \frac{xy - x - y}{3} \text{ to } y - \frac{y - x\alpha}{3}$$

where x and y are the lower and upper coefficients of thermal expansion of the lower (TiN) layer 350 and the upper (Lipocer) layer 400.

Preferably the intermediate layer 700 is bonded to the lower layer 350 (or substrate) on a side of the intermediate layer 700 opposite to the upper layer 400 and a bond strength between the intermediate layer 700 and the lower layer 350 (or substrate) is greater than a bond strength between the material of the upper layer 400 and the material of the lower layer 350 (or substrate). For example, in the case that the lower layer 350 is a layer of TiN and the upper layer 400 is a layer of Lipocer, the bond strength between the intermediate layer 700 and the TiN will be greater than would be the case between TiN and Lipocer. In an embodiment the bond strength between the intermediate layer 700 and the lower layer 350 (or substrate) is greater than between the lower layer 350 (or substrate) and $SiO_2$.

The bond strength between the intermediate layer 700 and lower layer 350 (or substrate is greater than a bond strength between the intermediate layer 700 and the upper layer 400. This is due to the difficulty of bonding of the material of the upper layer 400 with any particular material. However, in order to address this issue, the Young's Modulus and/or Poisson ratio of the intermediate layer 700 is within 20% of that of the upper layer 400, preferably within 15% and more preferably within 10%. The best bond is achievable if the Young's Modulus and/or Poisson ratio of the intermediate layer 700 is within 5% of that of the upper layer 400.

A mismatch in thermal expansion is undesirable as this can lead to stresses building up between different layers. Therefore preferably the intermediate layer 700 has a coefficient of thermal expansion within 20%, preferably within 15% and more preferably within 10% of that of the upper layer 400 and/or of that of the lower layer 350 (or substrate).

FIGS. 6 and 7 show transmissive and reflective stacks respectively, according to the invention, an interface or intermediate layer 700 is added between the lower (TiN) layer 350 and the coating with limited hydrophilicity, i.e., the upper (Lipocer) layer 400.

A list of optimal material for interface layer is as follows (here E denotes Young's modulus, v denotes Poisson ratio):

1) Boro-silicate glass; boro-phoshpo-silicate glass; fluoride glass (Young's modulus and Poisson ratio for all glasses are close to $SiO_2$ properties); all glasses that are transparent for VIS/IR, absorptive for DUV (same as underlying TiN), inert, (amorphous i.e. not crystalline which can lead to scattering) conform well to the underlying substrate and have good adhesion to TiN. Hermetic structured boro-silicate glass may be deposited by plasma-assisted E-beam evaporation which can be performed at low substrate temperatures of less than 80° C. Lift off processing where the glass is deposited on a removable layer can be used to pattern the glass layer.

2) Co-deposited $Al_2O_3+SiO_2$ or co-deposited $Al_2O_3+GeO_2$ (bond formation as in Zeolites, possible chemical bonding to Lipocer), E~120 GPa, v=0.1-0.3 at room temperature (note that v is adjustable by composition), transparent.

3) $TiO_2$ (only amorphous), E=60-160 GPa (reactive evaporation deposition allows a Young's Modulus at the lower end of this range to be achieved);

4) Ti, Au, Ag, Pt, Pd, E~70-100 GPa, v~0.3-0.4, good adhesion to TiN (metal-metalloid adhesion is favourable), metallic, will reflect NIR/VIS instead of TiN.

5) $Ti_xSi_y$ (best $Ti_5Si_3$)—same ceramic properties as TiN (for reflectivity), E~150 GPa—has natural $SiO_2$ on top, alternatively use $Ti_xGe_y$.

6) $ZrO_2$, $Y_2O_3$, $La_2O_3$—transparent oxides, E~100-150 GPa, inert (improved by a co-deposition to reduce density and Young's modulus).

7) $Al_2O_3$, $B_2O_3$, $HfO_2$—E~400-570 GPa, so mechanically unfavourable, yet provides insulation.

8) hBN (hexagonal Boron Nitride), or BxNy, where ratio x/y=0.7-1.3; E~20-100 GPa, v~0.2, will reflect VIS/NIR, but relatively weak, (same topology as graphite).

Second Embodiment

The second embodiment is the same as the first embodiment, but the interface or intermediate layer 700 consists of at least two layers (for example, $Al_2O_3$, $SiO_2$ or any other combination of material layers listed above). In this embodiment the required mechanical properties (Young's modulus and/or Poisson ratio) can be attributed to the first sub-layer and the insulating or optical properties can be attributed to the second sub-layer. Additionally, the thickness of the first sub-layer must be significantly larger than thickness of the second sub-layer, so effective mechanical properties of the intermediate layer (700) are similar to the properties of the first sub-layer.

Third Embodiment

Instead of deposition of an additional layer, the third embodiment proposes to modify top part of already present (TiN) layer 350 by:

oxidizing a top layer of TiN in plasma to produce a thin film of amorphous $TiO_2$; or increasing thickness of native oxide by high-temp annealing in Oxygen. Amorphous $TiO_2$ has Young modulus E~65-150 GPa and thus is much better compatible with Lipocer than original TiN.

In this embodiment, the thick film of $TiO_2$ can be seen as the interface or intermediate layer 700.

Note, that there may be an undesired effect if $Ti_2O_3$ is produced instead. It has structure as $Al_2O_3$ and thus higher Young's modulus (E~400-500 GPa), which is undesired.

Fourth Embodiment

In the previous embodiments, TiN is used as a conformal, reflecting coating, but other metal nitrides may have comparable properties. Thus, in this embodiment, the lower (TiN) layer 350 can be replaced for other metal nitride layer such as ZrN, YN, HfN, TaN, TiCrN, TiAlN and coated with any of the materials listed above and/or $SiO_2$ as the interface or intermediate layer 700.

Below are the features the inventors believe to be new over prior art:

Interface with optimal mechanical properties (range of Young's modulus and Poisson ratio);

Interface which may be insulating to prevent galvanic reactions on TiN-Lipocer interface; and Interface which may be reflecting (e.g., Gold) or transparent (as $SiO_2$—$Al_2O_3$).

A reflecting interface may provide improvement of lifetime of sensor in tools. For example, a reflecting interface (e.g., Gold) is a better reflector than TiN. This may improve heat related degradation of Lipocer over SMASH mark. A reflecting interface may also extend SMASH or level sensor wavelengths to shorter than 0.5 μm, which are poorly reflected by TiN.

Although the invention describes the upper (Lipocer) layer 400 adhesion to the lower layer 350 (the underlying substrate) as the goal, the mechanism is applicable to any polymer that may include any future replacement for Lipocer (they are generally less stiff then the ceramic of oxide deposited as the protecting/light blocking layer).

Although the invention describes improvement of adhesion to the lower 350, e.g., TiN, any other nitride with comparable properties should be also covered (as CrN, AlTiN, and TiAlN and ZrN, etc.).

The invention is described above in relation to a sensor mark and a hydrophobic layer or a coating with limited hydrophilicity. However, the invention can be applied to other surfaces of a sensor as well as to objects other than a sensor (e.g. lens elements, support tables etc.). The layer may be a layer other than a hydrophobic layer or a coating with limited hydrophilicity. For example the layer could be a transmissive or semi-transmissive or semi-impermeable or impermeable layer.

It is noted that an intermediate layer according to any of the embodiments described above can have the additional advantage that it acts as a protective barrier layer to seal other layers in a stack of layers from contact with water, such as ultra-pure water (UPW), in the immersion space between the projection system PS and the substrate W. In this way it prevents degradation of the stack of layers, especially for those layers which react to contact with ultra-pure water. Such a protective layer may further prevent oxidation of the underlying substrate.

It is further noted that the intermediate layer can be formed in the stack of layers by methods such as, for example, atomic layer deposition (ALD), sputtering, plasma deposition and chemical vapor deposition.

In an embodiment, there is provided a lithographic apparatus comprising an object, the object comprising: a substrate and optionally a lower layer on the substrate; an upper layer; and an intermediate layer between the upper layer and the substrate or lower layer, wherein a bond strength between the intermediate layer and the substrate or lower layer being greater than a bond strength between the intermediate layer and the upper layer and the intermediate layer has a Young's Modulus and/or a Poisson ratio within 20% of that of the upper layer.

In an embodiment, the intermediate layer is comprised of a plurality of sub-layers. In an embodiment, one of the plurality of sub layers comprises $SiO_2$ and $GeO_2$ or co-deposited $SiO_2$ and $GeO_2$. In an embodiment, the intermediate layer comprises a glass. In an embodiment, the glass is one or more selected from the group: boro-silicate glass, boro-phospho-silicate glass, fluoride glass. In an embodiment, the intermediate layer comprises co-deposited at least one of the materials: $Al_2O_3$, $Y_2O_3$, $B_2O_3$, $La_2O_3$, $ZrO_2$ and at least one of the materials: $GeO_2$, $SiO_2$. In an embodiment, the intermediate layer comprises amorphous $TiO_2$. In an embodiment, the intermediate layer comprises a metal. In an embodiment, the metal is one or more selected from the group: Ti, Au, Ag, Pt, Pd, Rh. In an embodiment, the intermediate layer comprises a transparent and chemically robust oxide. In an embodiment, the chemically robust oxide is one or more selected from the group: $ZrO_2$, $Y_2O_3$, $Al_2O_3$, $B_2O_3$, $HfO_2$. In an embodiment, the intermediate layer is a layer reflecting for VIS and NIR. In an embodiment, the lithographic apparatus comprises at least one patterned layer formed on the substrate, said patterned layer comprising a pattern of through holes and/or steps formed therein, wherein the upper layer and intermediate layer are formed on the at least one patterned layer. In an embodiment, the upper layer comprises an inorganic polymer. In an embodiment, the inorganic polymer has a Young's modulus in the range 30-70 GPa and Poisson ratio in the range 0.15-0.25. In an embodiment, the bond strength of the intermediate layer to the substrate or the lower layer is greater than a bond strength between the material of the upper layer and the material of the substrate or the lower layer. In an embodiment, the intermediate layer has a coefficient of thermal expansion within 20% of that of the upper layer and/or of that of the substrate or lower layer to which the intermediate layer is bonded. In an embodiment, the object is a sensor.

In an embodiment, there is provided an object for use in a lithographic apparatus comprising: a substrate and optionally a lower layer on the substrate; an upper layer; and an intermediate layer between the upper layer and the substrate or lower layer, wherein a bond strength between the intermediate layer and the substrate or lower layer being greater than a bond strength between the intermediate layer and the upper layer and the intermediate layer has a Young's Modulus and/or a Poisson ratio within 20% of that of the upper layer.

In an embodiment, the intermediate layer is comprised of a plurality of sub-layers. In an embodiment, the object is a sensor.

Although specific reference may be made in this text to the use of lithography apparatus in the manufacture of ICs, it should be understood that the lithography apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive, reflective, magnetic, electromagnetic and electrostatic optical components.

While specific embodiments have been described above, it will be appreciated that embodiments of the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:

1. A lithographic apparatus comprising an object, the object comprising:
   a substrate;
   an upper layer; and
   an intermediate layer between the upper layer and the substrate or between the upper layer and a lower layer on the substrate when on the substrate,
   wherein:
   a bond strength between the intermediate layer and the substrate or between the intermediate layer and the lower layer when on the substrate, is greater than a bond strength between the intermediate layer and the upper layer, and
   the intermediate layer has a Young's Modulus and/or a Poisson ratio within 20% of that of the upper layer.

2. The lithographic apparatus of claim 1, wherein the intermediate layer is comprised of a plurality of sub-layers.

3. The lithographic apparatus of claim 2, wherein one of the plurality of sublayers comprises $SiO_2$ and $GeO_2$ or co-deposited $SiO_2$ and $GeO_2$.

4. The lithographic apparatus of claim 1, wherein the intermediate layer comprises a glass.

5. The lithographic apparatus of claim 4, wherein the glass is one or more selected from: boro-silicate glass, boro-phospho-silicate glass, and/or fluoride glass.

6. The lithographic apparatus of claim 1, wherein the intermediate layer comprises co-deposited at least one selected from: $Al_2O_3$, $Y_2O_3$, $B_2O_3$, $La_2O_3$, and/or $ZrO_2$, and at least one selected from: $GeO_2$ and/or $SiO_2$.

7. The lithographic apparatus of claim 1, wherein the intermediate layer comprises amorphous $TiO_2$.

8. The lithographic apparatus of claim 1, wherein the intermediate layer comprises a metal.

9. The lithographic apparatus of claim 8, wherein the metal is one or more selected from: Ti, Au, Ag, Pt, Pd, and/or Rh.

10. The lithographic apparatus of claim 1, wherein the intermediate layer comprises a transparent and chemically robust oxide.

11. The lithographic apparatus of claim 10, wherein the chemically robust oxide is one or more selected from: $ZrO_2$, $Y_2O_3$, $Al_2O_3$, $B_2O_3$, and/or $HfO_2$.

12. The lithographic apparatus of claim 1, wherein the intermediate layer is a layer reflective of visible radiation and near infrared radiation.

13. The lithographic apparatus of claim 1, comprising at least one patterned layer formed on the substrate, the patterned layer comprising a pattern of through holes and/or steps formed therein, wherein the upper layer and intermediate layer are formed on the at least one patterned layer.

14. The lithographic apparatus of claim 1, wherein the upper layer comprises an inorganic polymer.

15. The lithographic apparatus of claim 14, wherein the inorganic polymer has a Young's modulus in the range of 30-70 GPa and Poisson ratio in the range of 0.15-0.25.

16. The lithographic apparatus of claim 1, wherein the bond strength of the intermediate layer to the substrate or to the lower layer when on the substrate, is greater than a bond strength between the material of the upper layer and the material of the substrate or of the lower layer when on the substrate.

17. The lithographic apparatus of claim 1, wherein the intermediate layer has a coefficient of thermal expansion within 20% of that of the upper layer and/or of that of the substrate or lower layer when on the substrate, to which the intermediate layer is bonded.

18. The lithographic apparatus of claim 1, wherein the object is a sensor component.

19. An object for use in a lithographic apparatus, the object comprising:
   a substrate;
   an upper layer; and
   an intermediate layer between the upper layer and the substrate or between the upper layer and a lower layer on the substrate when on the substrate,
   wherein:
   a bond strength between the intermediate layer and the substrate or between the intermediate layer and the lower layer when on the substrate, is greater than a bond strength between the intermediate layer and the upper layer, and
   the intermediate layer has a Young's Modulus and/or a Poisson ratio within 20% of that of the upper layer.

20. The object of claim 19, wherein the intermediate layer is comprised of a plurality of sub-layers.

21. The object of claim 19, wherein the intermediate layer comprises a glass.

22. The object of claim 19, comprising at least one patterned layer formed on the substrate, the patterned layer comprising a pattern of through holes and/or steps formed therein, wherein the upper layer and intermediate layer are formed on the at least one patterned layer.

23. The object of claim 19, wherein the object is a sensor component.

* * * * *